(12) United States Patent
Komiyama et al.

(10) Patent No.: US 10,743,444 B2
(45) Date of Patent: Aug. 11, 2020

(54) FEEDER MAINTENANCE DEVICE AND CONTROL METHOD THEREOF

(71) Applicant: FUJI CORPORATION, Chiryu-shi (JP)

(72) Inventors: Nobuhisa Komiyama, Okazaki (JP); Tomonori Yanagi, Nagakute (JP)

(73) Assignee: FUJI CORPORATION, Chiryu-shi (JP)

( * ) Notice: Subject to any disclaimer, the term of this patent is extended or adjusted under 35 U.S.C. 154(b) by 242 days.

(21) Appl. No.: 15/754,108

(22) PCT Filed: Aug. 25, 2015

(86) PCT No.: PCT/JP2015/073845
§ 371 (c)(1),
(2) Date: Feb. 21, 2018

(87) PCT Pub. No.: WO2017/033283
PCT Pub. Date: Mar. 2, 2017

(65) Prior Publication Data
US 2018/0249604 A1 Aug. 30, 2018

(51) Int. Cl.
*H05K 13/02* (2006.01)
*H05K 13/04* (2006.01)
*H05K 13/08* (2006.01)

(52) U.S. Cl.
CPC ......... *H05K 13/02* (2013.01); *H05K 13/0419* (2018.08); *H05K 13/0895* (2018.08)

(58) Field of Classification Search
CPC combination set(s) only.
See application file for complete search history.

(56) References Cited

U.S. PATENT DOCUMENTS

| 2014/0262051 A1 | 9/2014 | Youngquist |
| 2014/0277680 A1* | 9/2014 | Youngquist .......... B23K 26/352 700/121 |
| 2016/0212897 A1 | 7/2016 | Tsuge et al. |

FOREIGN PATENT DOCUMENTS

| JP | 62-58132 A | 3/1987 |
| JP | 2004-111947 A | 4/2004 |
| JP | 2009-135525 A | 6/2009 |
| JP | 2013-55116 A | 3/2013 |
| JP | 2014-168020 A | 9/2014 |
| JP | 2014-220314 A | 11/2014 |

(Continued)

OTHER PUBLICATIONS

Machine translation of JP 2014-22317.*
(Continued)

*Primary Examiner* — Erin F Bergner
(74) *Attorney, Agent, or Firm* — Oblon, McClelland, Maier & Neustadt, L.L.P.

(57) ABSTRACT

A feeder maintenance device cleans specified sections including a feeding mechanism of a feeder using cleaning sections, and measures backlash of the feeding mechanism using a backlash inspection section. In this manner, because the feeder maintenance device performs cleaning of the feeder, compared to an operator performing cleaning, it is possible to curtail variance in a quality of maintenance. Also, because the feeder maintenance device measures the backlash of the feeding mechanism, it is possible to reliably perform maintenance related to the feeding mechanism of the feeder.

20 Claims, 10 Drawing Sheets

(56) References Cited

FOREIGN PATENT DOCUMENTS

| | | |
|---|---|---|
| JP | 2014-220317 A | 11/2014 |
| JP | 2015-001599 | 1/2015 |
| JP | WO 2015/025383 A1 | 2/2015 |

OTHER PUBLICATIONS

International Search Report dated Nov. 17, 2015 in PCT/JP2015/073845 filed Aug. 25, 2015.
Extended European Search Report dated May 23, 2018 in Patent Application No. 15902252.4, 8 pages.

* cited by examiner

FIG. 9

| Consumable part | State | Warning value | Prohibition value | Maintenance count | Reset |
|---|---|---|---|---|---|
| Lubricant (syringe A) | OK | 120 | 150 | 100 | |
| Lubricant (syringe B) | OK | 120 | 150 | 100 | |
| Lubricant (syringe C) | OK | 120 | 150 | 100 | |
| Cleaning liquid | ! ERROR ! | 180 | 200 | 200 | |
| Reference tape | ! WARNING | 280 | 300 | 290 | |
| Drive pin A | OK | 900 | 1000 | 800 | |
| Drive pin B | OK | 900 | 1000 | 800 | |
| Air filter | OK | 450 | 500 | 420 | |
| Waste liquid filter | OK | 450 | 500 | 420 | |

… (US 10,743,444 B2)

FEEDER MAINTENANCE DEVICE AND CONTROL METHOD THEREOF

TECHNICAL FIELD

The present disclosure relates to a feeder maintenance device and a control method thereof.

BACKGROUND ART

Conventionally, as a feeder maintenance device for maintaining a tape feeder, a device has been proposed in which a first maintenance work section provided with a sprocket drive torque measurement section and a feeding accuracy measurement section and a second maintenance work section provided with a tape retainer member height measurement section are arranged in a moving body, and maintenance of tape feeders is performed sequentially by moving the moving body (for example, refer to patent literature 1).

CITATION LIST

Patent Literature

Patent literature 1: JP-A-2014-220314

BRIEF SUMMARY

Problem to be Solved

However, with the device of patent literature 1 above, even though it is possible to measure the drive torque of the sprocket, feeding accuracy of tape, and the height of the tape retaining member, no consideration is given to other measurements, and it is desirable to improve measurement related to tape feeding of a feeder. Also, cleaning of feeders must be performed by an operator, so variance arises in the quality.

The present disclosure takes account of such problems, and an object thereof is to provide a feeder maintenance device and control method thereof capable of more reliably performing maintenance related to a feeding mechanism of a feeder.

Means for Solving the Problem

The present disclosure uses the following means to achieve the above object.

A feeder maintenance device of the present disclosure includes:

an attachment section configured to have a feeder attached, the feeder being provided with a feeding mechanism that feeds a storage member that stores a component and being used in a mounting device which mounts the component on a board;

a cleaning section configured to clean a specified section including the feeding mechanism of the feeder;

a measurement section configured to measure backlash of the feeding mechanism; and a control section configured to control the cleaning section and the measurement section.

With this device, a specified section including the feeding mechanism of the feeder is cleaned by the cleaning section, and backlash of the feeding mechanism is measured by the measurement section. In this manner, because the feeder maintenance device performs cleaning of the feeder, compared to an operator performing cleaning, it is possible to curtail variance in the quality of maintenance. Also, because the feeder maintenance device measures the backlash of the feeding mechanism, it is possible to reliably perform maintenance related to the feeding mechanism of the feeder. Here, a "feeding mechanism" may include a sprocket and a gear mechanism.

BRIEF DESCRIPTION OF DRAWINGS

FIG. 9 shows an example of consumable parts screen 100.

DETAILED DESCRIPTION

Figure 1:
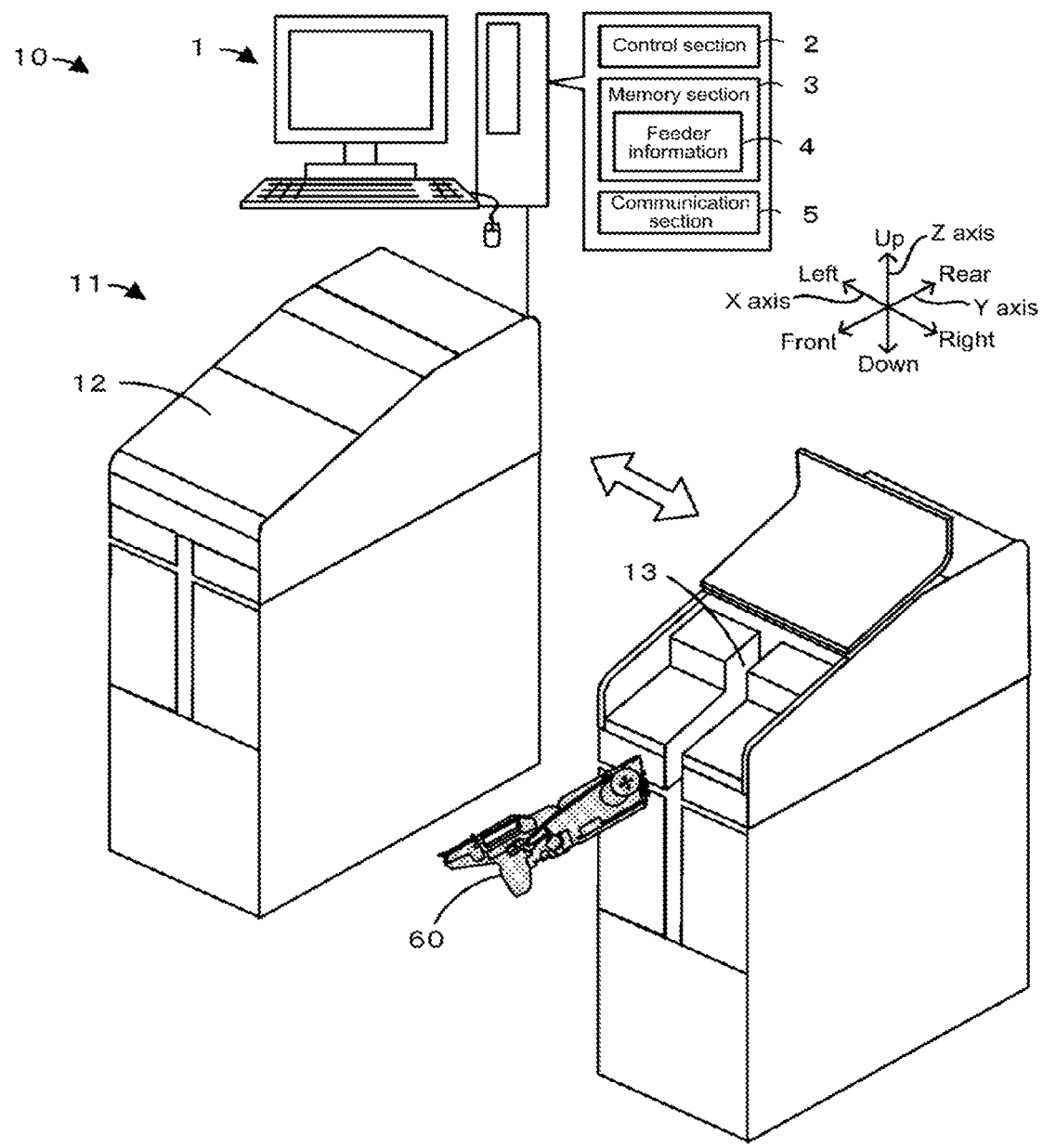
FIG. 1 is a schematic view of feeder maintenance system 10.
Figure 2:
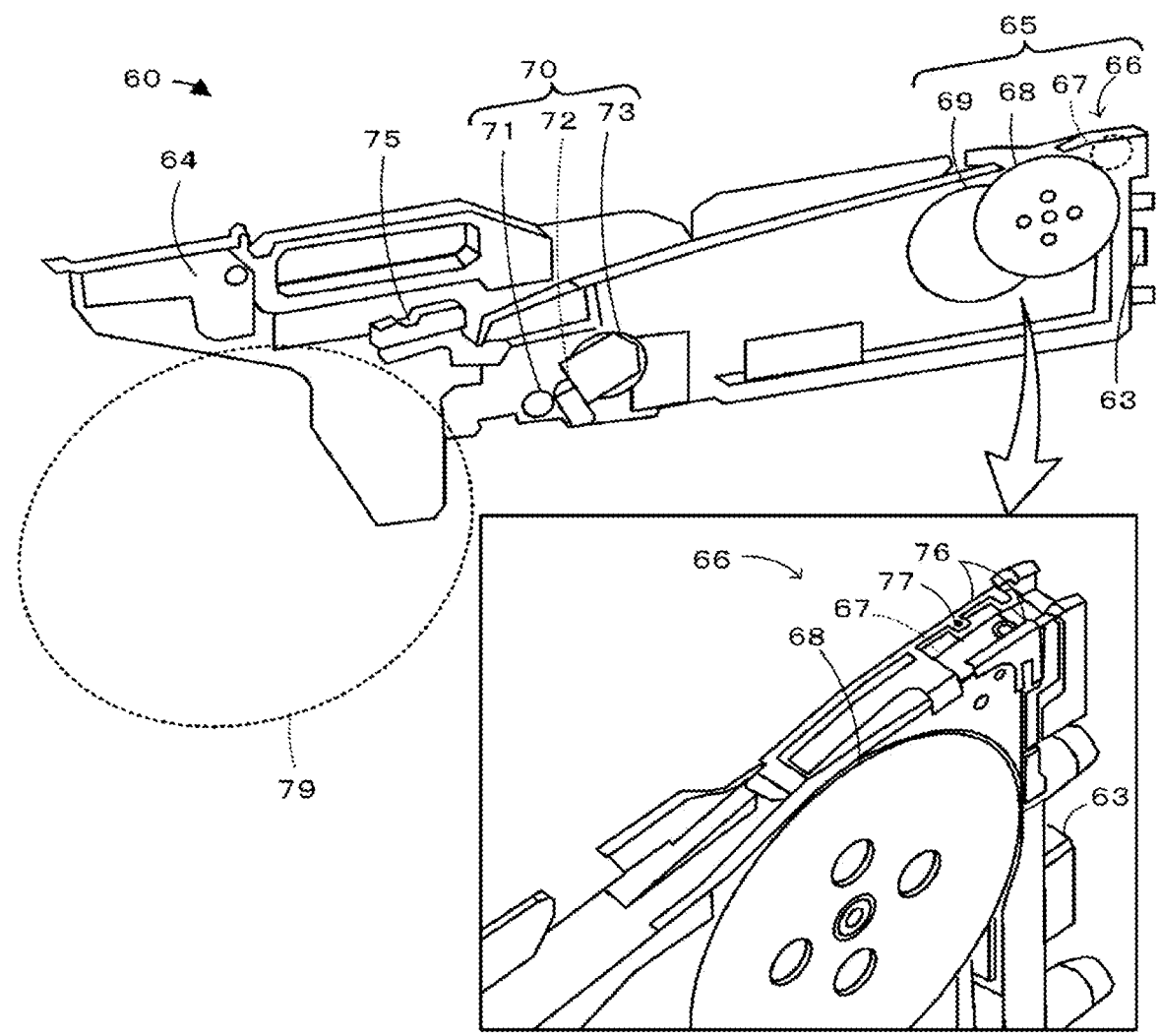
FIG. 2 is a schematic view of feeder 60.
Figure 3:
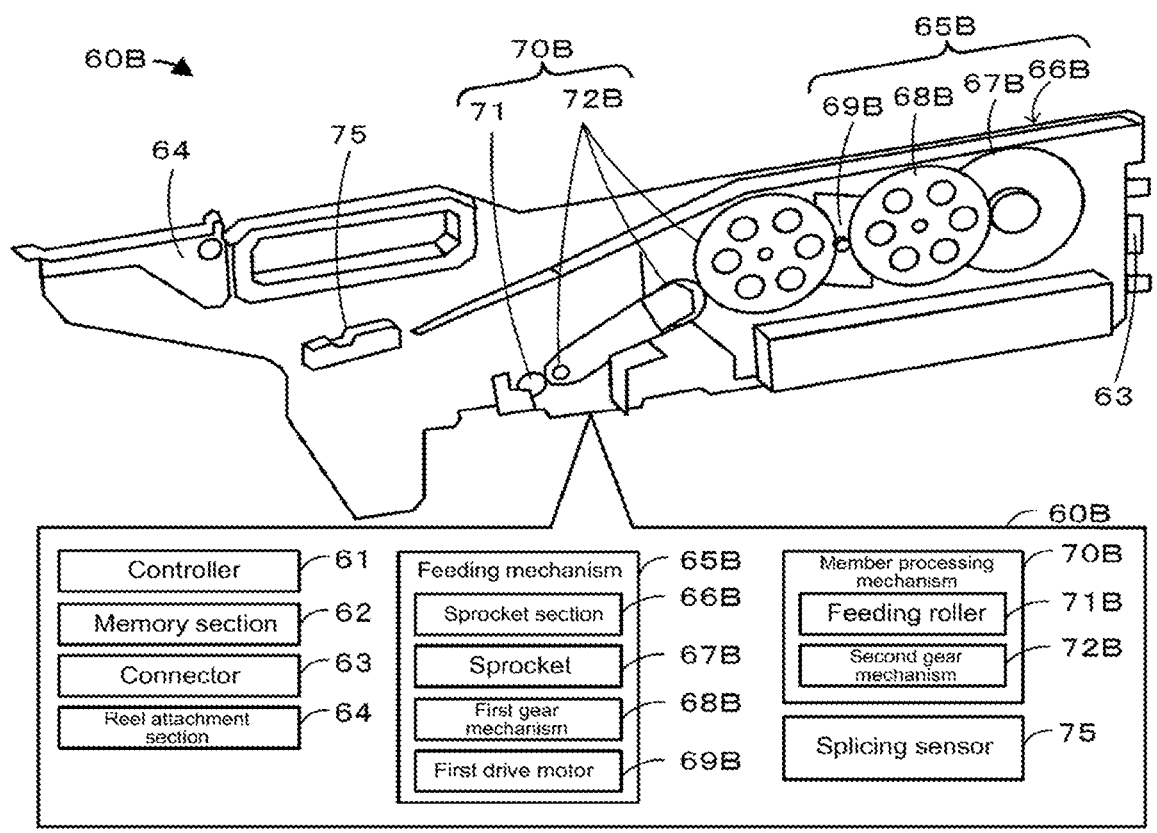
FIG. 3 is a schematic view of feeder 60B.
Figure 4:
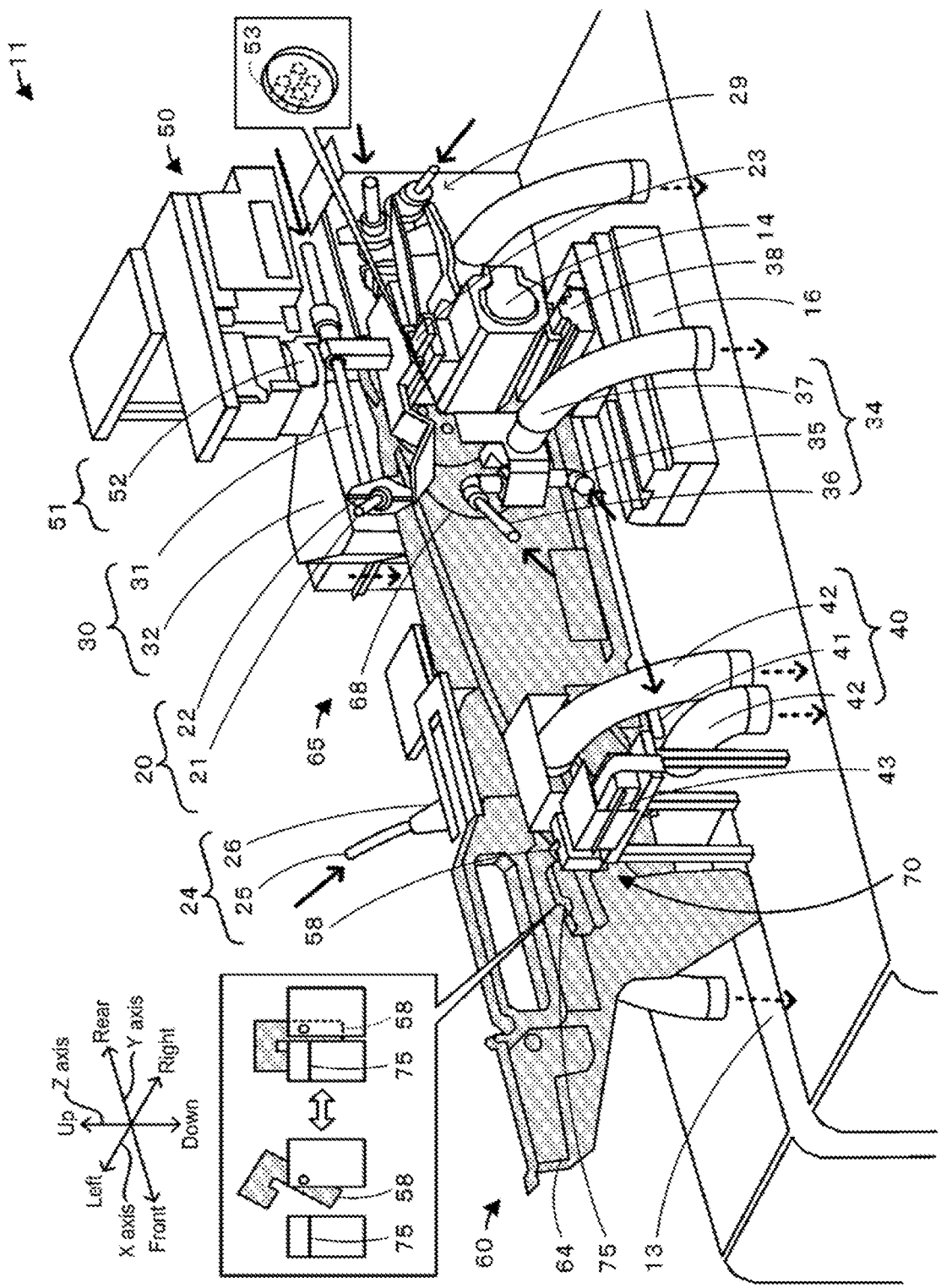
FIG. 4 shows feeder attachment section 13 of feeder maintenance device 11.
Figure 5:
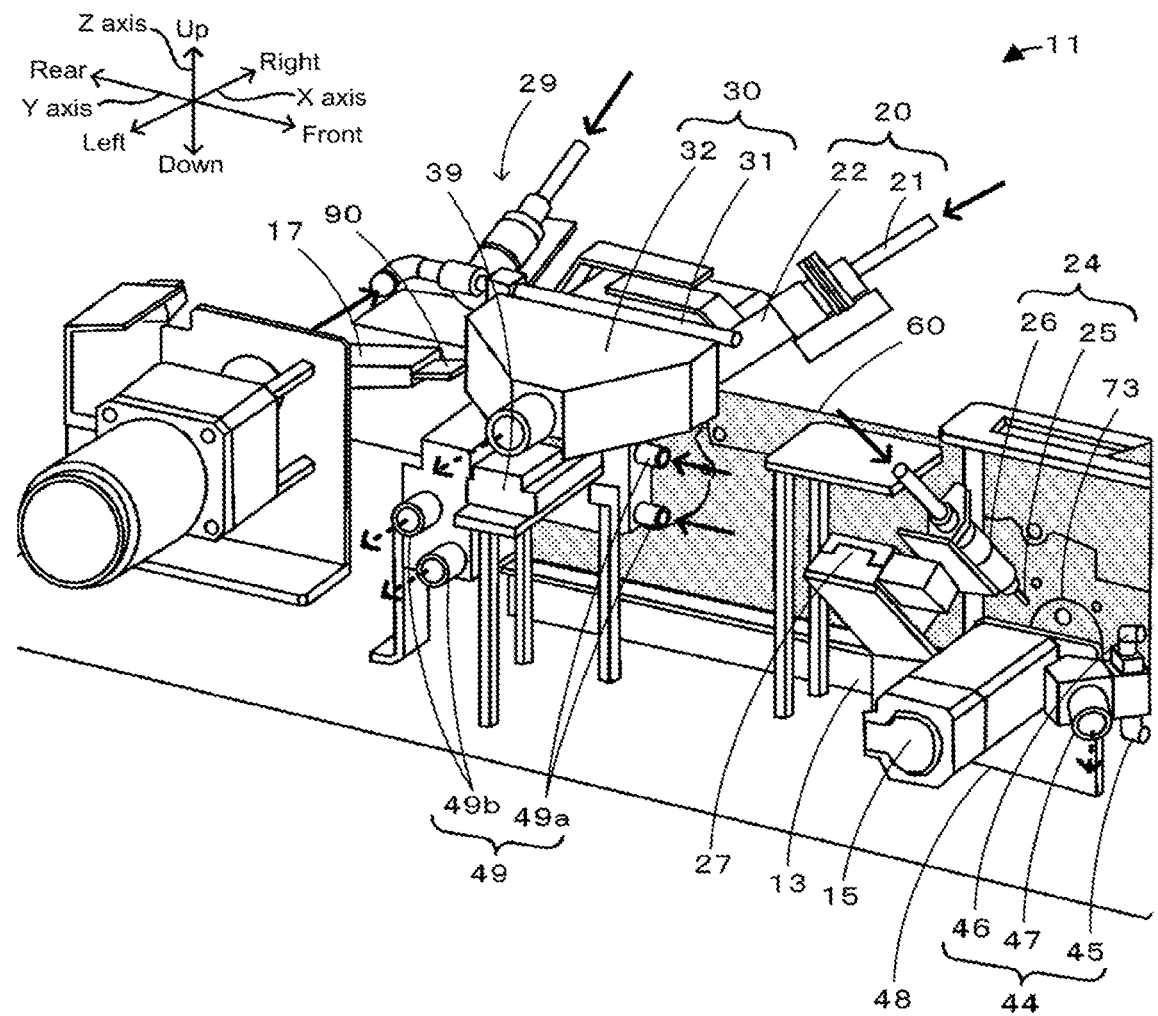
FIG. 5 shows feeder attachment section 13 of feeder maintenance device 11.
Figure 6:
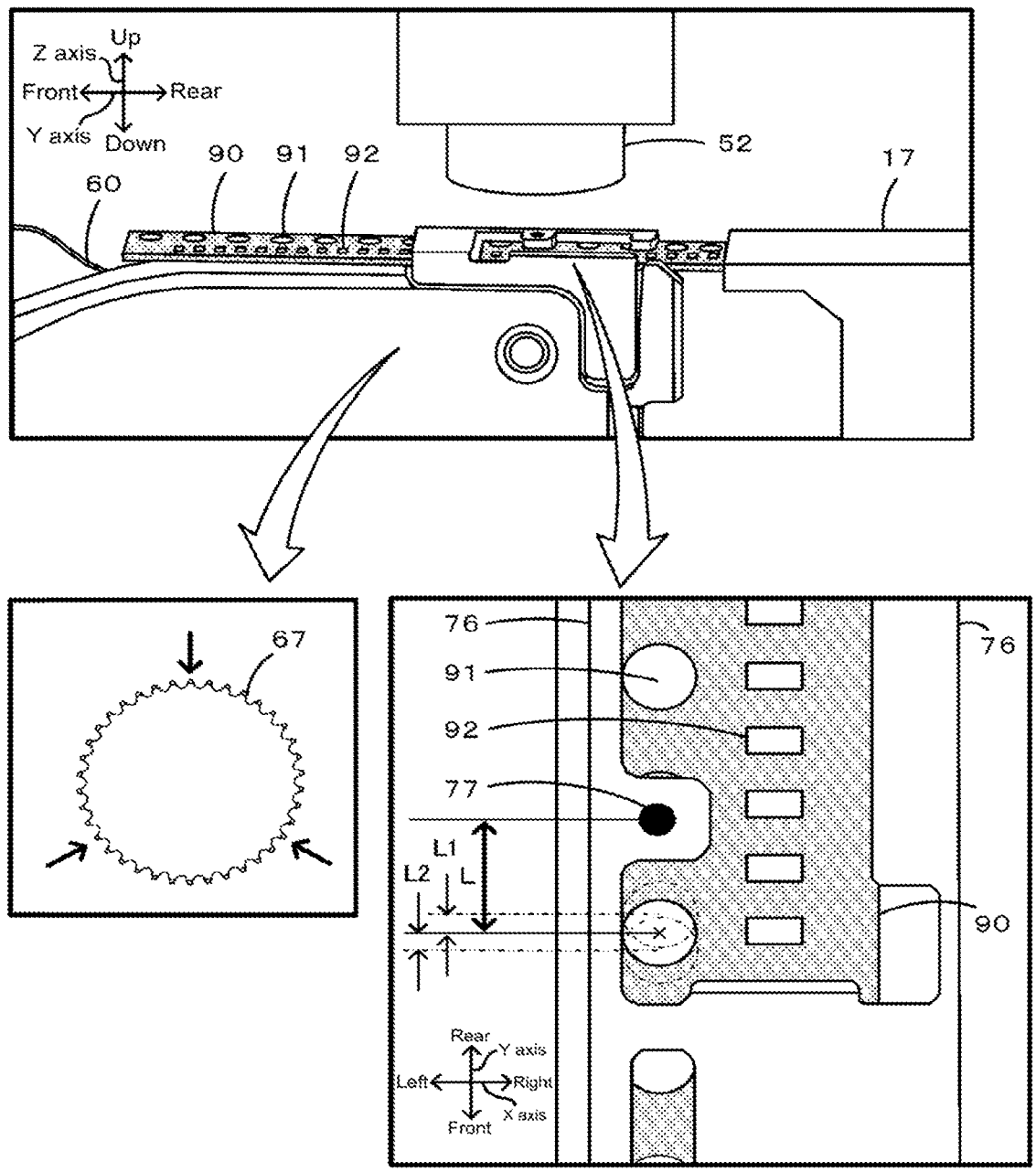
FIG. 6 shows backlash inspection section 51.
Figure 7:
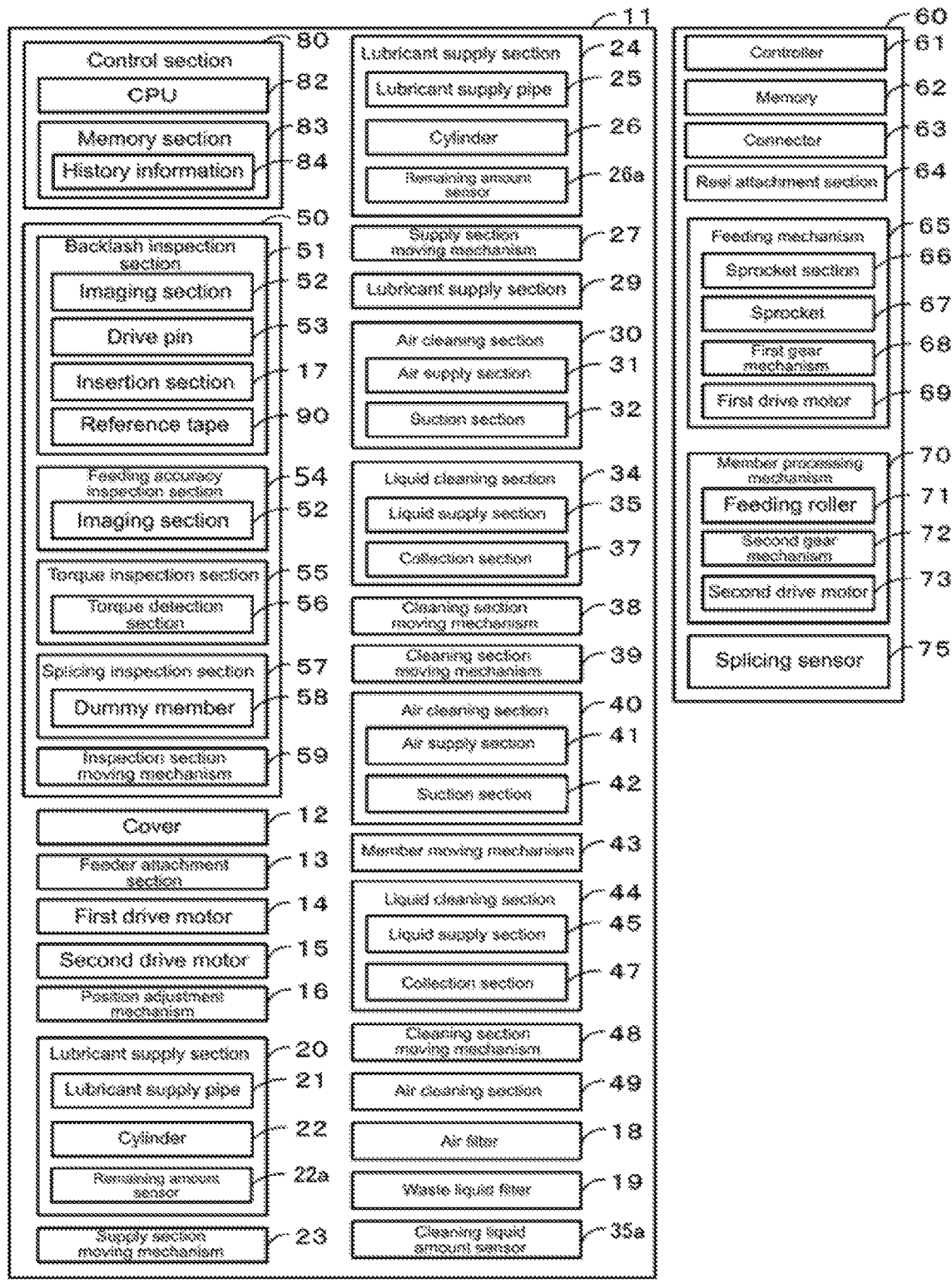
FIG. 7 is a block diagram showing the configuration of feeder maintenance device 11.

Hereinafter, an embodiment of the present disclosure will be described with reference to the figures. FIG. 1 is a schematic view of feeder maintenance system 10. FIG. 2 is a schematic view of feeder 60. FIG. 3 is a schematic view of feeder 60B. FIG. 4 shows feeder attachment section 13 of feeder maintenance device 11. FIG. 5 shows feeder attachment section 13 of feeder maintenance device 11. FIG. 6 shows backlash inspection section 51. FIG. 7 is a block diagram showing the configuration of feeder maintenance device 11. Feeder maintenance system 10 of the present embodiment is provided with management computer (PC) 1 and feeder maintenance device 11. Management PC 1 is a PC for managing information for handling feeder maintenance device 11 and the like. Feeder maintenance device 11 is a device for performing maintenance and inspection of feeders 60 and 60B and the like that are attached to a mounting device that mounts components on a board. Feeder maintenance device 11 is configured with feeder attachment section 13 to which multiple types of feeders can be attached. Here, descriptions are mainly giving using feeder 60, with feeder 60 and feeder 60B being examples. In the present embodiment, left-right directions (X axis), front-rear directions (Y axis), and up-down directions (Z axis) are set as shown in FIG. 1.

Feeder 60 is attached to a mounting device, which is not shown, and supplies components to a mounting unit that picks up the components and moves in XY directions. When attached to the mounting device, feeder 60 is loaded with reel 79 (refer to FIG. 2) around which is wound tape that stores components, the reel 79 being loaded so as to be able to rotate. As shown in FIGS. 2 and 7, feeder 60 is provided with controller 61, memory section 62, connector 63, reel attachment section 64, feeding mechanism 65, member processing mechanism 70, and splicing sensor 75. Controller 61 performs overall control of feeder 60. Memory section 62 is, for example, flash memory, and memorizes information related to feeder 60, for example, type information and identification information of feeder 60, information of reel 79 that is loaded, information of components held in the reel, and the like. Connector 63 is connected to a connector of the mounting device or a connector of feeder maintenance device 11, such that communication is possible with the control section. Reel attachment section 64 is configured such that reel 79 can be attached and removed.

Feeding mechanism 65 feeds tape pulled out from reel 79. Feeding mechanism 65 is provided with sprocket 67, first gear mechanism 68, first drive motor 69, and the like. Note that, a top peripheral section of a leading end of feeder 60 at which external teeth of sprocket 67 are exposed is referred to as sprocket section 66. Sprocket 67 is an external gear for feeding rearwards tape unwound from reel 79. First gear mechanism 68 is a mechanism for transmitting driving force of first drive motor 69 to sprocket 67, and is configured from multiple gears of different sizes. First drive motor 69 is for rotationally driving sprocket 67, and may be a stepping motor. Member processing mechanism 70 is for feeding and discarding top film (covering member) that is peeled from bottom tape. Member processing mechanism 70 is provided with feeding roller 71, second gear mechanism 72, and second drive motor 73. Feeding roller 71 sandwiches the top film and feeds it to the outside. Second gear mechanism 72 is a mechanism for transmitting driving force of second drive motor 73 to feeding roller 71, and includes at least one gear. Second drive motor 73 is for rotationally driving feeding roller 71, and may be a stepping motor.

The tape, which is not shown, is configured from bottom tape in which are formed cavities (recesses) at a specified pitch in the lengthwise direction, and top film that covers the surface of the bottom tape, with a component P stored in each of the cavities. The top film is peeled from the bottom tape at a position in front of the component supply position of the mounting device, moved along a film guide, sandwiched by feeding roller 71 of member processing mechanism 70, fed to the outside, and discarded. Feeding holes are also formed in the bottom tape in a lengthwise direction. Teeth of sprocket 67 engage with the feeding holes. The tape is moved along guide frame 76 (refer to FIGS. 2 and 6) extending in a front-rear direction and provided at both the left and right sides of feeder 60. Circular reference mark 77 is formed on guide frame 76 as a reference position. The mounting device and feeder maintenance device 11 are set to obtain an error in the feeding amount of the tape, backlash of first gear mechanism 68, and the like, based on the positional relationship between the feeding holes (or cavities) of the tape and reference mark 77.

Splicing sensor 75 is for detecting a joining section of tapes. With feeder 60, at a final stage of using a tape, processing (splicing processing) is performed in which the tail end of tape in use is aligned with and fixed to the leading end of tape from a new reel. With feeder 60, splicing sensor 75 detects the joining section, and performs continuous management of the new reel 79. Splicing processing uses a metal fixing member, and splicing sensor 75 is configured from a sensor that detects metal.

Next, feeder 60B is described using FIG. 3. Since the basic structure of feeder 60B is the same as that of feeder 60, the same symbols are assigned to the same configurations, and descriptions thereof are omitted. Feeder 60B is provided with feeding mechanism 65B and member processing mechanism 70B. Feeding mechanism 65B is provided with sprocket section 66B including sprocket 67B, first gear mechanism 68B, and first drive motor 69B. Also, member processing mechanism 70B is provided with feeding roller 71B and second gear mechanism 72. Second gear mechanism 72B engages with first drive motor 69B. That is, with feeder 60B, first drive motor 69B also acts as a second drive motor, such that only one drive motor is provided. As well as gears, second gear mechanism 72B includes a belt drive section.

Next, feeder maintenance device 11 that maintains feeders 60 and 60B is described. As shown in FIGS. 1 and 4 to 7, feeder maintenance device 11 is provided with cover 12, feeder attachment section 13, first drive motor 14, second drive motor 15, position adjustment mechanism 16, insertion section 17, and the like. Also, feeder maintenance device 11 is provided with lubricant supply sections 20, 24, and 29, supply section moving mechanisms 23 and 27, air cleaning sections 30, 40, and 49, liquid cleaning sections 34 and 44, cleaning section moving mechanisms 38, 39, and 48, member moving mechanism 43, inspection unit 50, and control section 80.

Cover 12 covers the top of feeder attachment section 13, and is opened when feeder 60 is attached to feeder attachment section 13, and is closed when maintenance and inspection of feeder 60 is performed. Feeder attachment section 13 is a section to which feeder 60 or feeder 60B used in a mounting device that mounts components on a board are attached, and is provided with a connection section, which is not shown, that connects with connector 63. First drive motor 14 is for driving a gear on feeding mechanism 65 of feeder 60, and is provided at the right rear of the device (refer to FIG. 4). Drive pin 53 that engages with feeding mechanism 65 is provided at the leading end of first drive motor 14. Drive pin 53 is inserted into a hole section formed in a gear of first gear mechanism 68. In this state, first drive motor 14 is able to rotate a gear of first gear mechanism 68. Second drive motor 15 is for driving a gear of member processing device 70 of feeder 60, and is provided at a front left section of the device (refer to FIG. 5). Second drive motor 15 is provided with a drive pin in a similar manner to first drive motor 14.

Position adjustment mechanism 16 is for relatively moving feeder 60 attached to feeder attachment section 13 and the lubricant supply sections and cleaning sections. Position adjustment mechanism 16 moves items such as first drive motor 14, lubricant supply sections 20 and 29, air cleaning section 30, and liquid cleaning section 34 in a front-rear direction at a rear side of the device (front side of feeder 60). Note that, for ease of understanding, in the present embodiment, air cleaning sections 30 and 40, liquid cleaning sections 34 and 44, and the like, which clean feeder 60, are referred to as cleaning sections. With feeder maintenance device 11, the configuration that faces feeding mechanism 65 of feeder 60 is moved in a front-rear direction without moving a configuration that faces member processing mechanism 70 of feeder 60 in a front-rear direction as a reference position. In this manner, with feeder maintenance device 11, lubricant supply sections and cleaning sections are made to face each configuration of the feeder, such that supply of lubricant and cleaning of each configuration can be performed for various types of feeders. Position adjustment mechanism 16 is configured from a guide member formed in a front-rear direction of the device, a slider along which a configuration that performs maintenance processing (lubricant supply sections and cleaning sections) moves while being guided by a guide section, and an actuator that moves the slider. Note that, with feeder maintenance device 11, for example, cleaning is performed using air for configurations such as sprocket 67 and feeding roller 71 that are not applied with lubricant to prevent problems such as slipping or adherence of foreign matter due to lubricant. Also, with feeder maintenance device 11, for example, cleaning is performed using liquid for configurations such as first gear mechanism 68 and second gear mechanism 72 lubricated with lubricant.

Lubricant supply section 20 supplies lubricant (for example, grease or lubricating oil) to a drive section (first gear mechanism 68) of feeding mechanism 65 of feeder 60 (refer to FIG. 4). Note that, in FIGS. 4 and 5, only a portion of each of the supply pipes and so on is shown in order to clearly shown other configurations. Also, in FIGS. 4 and 5, a portion or all of items such as covers is omitted in order to clearly show other configurations. Further, in FIGS. 4 and 5, supplied items such as lubricant, water, and cleaning liquid are shown by solid arrows at the supply side, and are shown by dashed arrows at the collection side. Lubricant supply section 20 is provided with lubricant supply pipe 21, cylinder 22, remaining amount sensor 22a (refer to FIG. 7), and a positioning member, which is not shown. Lubricant supply pipe 21 is formed of a flexible resin member. Cylinder 22 stores lubricant supplied from an external section, and discharges lubricant from lubricant supply pipe 21 using air pressure. Remaining amount sensor 22a detects the remaining amount of lubricant based on a position of a piston member that pushes lubricant stored inside the cylinder or the like. Remaining amount sensor 22a may be a contact type sensor, or a non-contact type sensor such as an optical or magnetic sensor. The positioning member is a member into which lubricant supply pipe 21 is inserted, and supports lubricant supply pipe 21 in a fixed manner. Lubricant supply pipe 21 is inserted into the positioning member, and a through-hole which guides an end of lubricant supply pipe 21 to a specified lubricant supply position is formed in the positioning member. The positioning member is adjusted such that the end of lubricant supply pipe 21 is fixed to a position that does not interfere with the movement of the gears of first gear mechanism 68. Lubricant supply section 20 is installed in supply section moving mechanism 23. Supply section moving mechanism 23 moves lubricant supply section 20 to and from a specified maintenance position and a specified retract position. Supply section moving mechanism 23 is configured from a guide member formed in the left-right direction of the device, a slider on which lubricant supply section 20 is installed and which is guided by a guide section when moving, and an actuator which moves the slider. Also, lubricant supply section 29 (refer to FIG. 4) supplies lubricant to first gear mechanism 68, and is provided with a lubricant supply pipe, a cylinder, a positioning member, and the like; however, as these are similar to lubricant supply section 20, specific descriptions thereof are omitted.

Lubricant supply section 24 supplies lubricant to the drive section (second gear mechanism 72) of member processing mechanism 70 of feeder 60 (refer to FIG. 5). Lubricant supply section 24 is provided with lubricant supply pipe 25, cylinder 26, remaining amount sensor 26a (refer to FIG. 7), and a positioning member, which is not shown. The configurations of lubricant supply section 24 are similar to those of lubricant supply section 20, therefore descriptions thereof are omitted here. Lubricant supply section 24 is installed on supply section moving mechanism 27. Supply section moving mechanism 27 moves lubricant supply section 24 to and from a specified maintenance position and a specified retract position. Supply section moving mechanism 27 is configured from a guide member formed in the left-right direction of the device, a slider on which lubricant supply section 24 is installed and which is guided by a guide section when moving, and an actuator which moves the slider.

Air cleaning section 30 cleans sprocket section 66 (feeding section) of feeding mechanism 65 using air. Air cleaning section 30 removes foreign matter (for example, portions of the top film, particles of adhesive that adhere to the top film, and the like) such as dust that adheres to sprocket section 66 by blowing air onto sprocket section 66. Air cleaning section 30 is provided with air supply section 31 and suction section 32. Air supply section 31 is a pipe-shaped member in which a hole is formed in the bottom surface, and which is arranged along guide frame 76 of feeder 60. An air supply pipe is connected to air supply section 31, and air is supplied from a compressor, which is not shown, via the air supply pipe. Suction section 32 sucks in air via sprocket section 66, and is provided with a cover that covers the top portion of sprocket section 66, and a suction pipe which is connected to the cover. The suction pipe is connected to a vacuum generator, which is not shown. Air supply section 31 is installed on supply section moving mechanism 23, and is moved to and from the cleaning position and the retract position by supply section moving mechanism 23. Suction section 32 is installed on cleaning section moving mechanism 39 (refer to FIG. 5), and is moved between the cleaning position and the retract position by cleaning section moving mechanism 39. Cleaning section moving mechanism 39 is configured from a guide member formed in the left-right direction of the device, a slider on which suction section 32 is installed and which is guided by a guide section when moving, and an actuator which moves the slider. Air filter 18 that removes foreign matter is arranged in the suction pipe of air cleaning section 30.

Liquid cleaning section 34 cleans first gear mechanism 68 (drive section) of the feeding mechanism 65 using a cleaning liquid. Liquid cleaning section 34 removes old lubricant adhered to first gear mechanism 68 using the cleaning liquid. Liquid cleaning section 34 is provided with liquid supply section 35, air supply section 36, and collection section 37. A cleaning liquid supply pipe is connected to liquid supply section 35, and the cleaning liquid is supplied from a tank, which is not shown, via the cleaning liquid supply pipe. Further, cleaning liquid amount sensor 35a that detects the remaining amount of cleaning liquid, and which may be a contact type or non-contact type sensor, is arranged in the tank. An air supply pipe is connected to air supply section 36, and air is supplied from a compressor, which is not shown, via the air supply pipe. Liquid cleaning section 34 sprays cleaning liquid onto the gears of first gear mechanism 68 from a discharging port using air that is discharged from air supply section 36. The cleaning liquid includes an organic solvent that is capable of dissolving the lubricant. Examples of the organic solvent include alcohol, acetone, isohexane, and the like. Collection section 37 collects the cleaning liquid via first gear mechanism 68, and is provided with a receiving member arranged to surround the discharging port, and a collection pipe connected to the receiving member. The collection pipe is connected to a vacuum generator, which is not shown. Waste liquid filter 19 that removes foreign matter is arranged in the collection pipe of liquid cleaning section 34. Liquid cleaning section 34 is installed on cleaning section moving mechanism 38, and is moved to and from the cleaning position and the retract position by cleaning section moving mechanism 38. Cleaning section moving mechanism 38 is configured from a guide member formed in the left-right direction of the device, a slider on which liquid cleaning section 34 is installed and which is guided by a guide section when moving, and an actuator which moves the slider.

Air cleaning section 40 cleans feeding rollers 71 (feeding sections) of member processing mechanism 70 using air. Air cleaning section 40 removes foreign matter (for example, portions of the top film, particles of adhesive that adhere to the top film, and the like) such as dust that adheres to feeding roller 71 by blowing air onto feeding roller 71. Air cleaning section 40 is provided with air supply section 41 and suction section 42. An air supply pipe is connected to air supply section 41, and air is supplied from a compressor, which is not shown, via the air supply pipe. Suction section 42 sucks in air via feeding roller 71, and is provided with a cover, which is not shown, that covers feeding roller 71, and a suction pipe that is connected to the cover. The suction pipe is connected to a vacuum generator, which is not shown. Air filter 18 that removes foreign matter is arranged in the suction pipe of air cleaning section 40. Note that, air filters of air cleaning sections 30 and 40 may be arranged in each respectively, or one air filter may be shared by both.

Liquid cleaning section 44 cleans second gear mechanism 72 (drive section) of member processing mechanism 70 using the cleaning liquid (refer to FIG. 5). Liquid cleaning section 44 is provided with liquid supply section 45, air supply section 46, and collection section 47. Liquid supply section 45, air supply section 46, and collection section 47 have similar configurations to liquid supply section 35, air supply section 36, and collection section 37, respectively, and so specific descriptions thereof are omitted here. Waste liquid filter 19 that removes foreign matter is arranged in the collection pipe of liquid cleaning section 44. Note that, waste liquid filters of liquid cleaning sections 34 and 44 may be arranged in each respectively, or one air filter may be shared by both. Liquid cleaning section 44 is installed on cleaning section moving mechanism 48, and is moved to and from the cleaning position and the retract position by cleaning section moving mechanism 48. Cleaning section moving mechanism 48 is configured from a guide member formed in the left-right direction of the device, a slider on which liquid cleaning section 44 is installed and which is guided by a guide section when moving, and an actuator which moves the slider.

Air cleaning section 49 is installed on the left rear side of the device, and cleans first gear mechanism 68 from the left side of feeder 60 using air. Air cleaning section 49 is provided with air supply section 49a and suction section 49b; however, as these are similar to those of air cleaning section 40, specific descriptions thereof are omitted. Air cleaning section 49 is installed on cleaning section moving mechanism 39 and is moved to and from the cleaning position and the retract position.

As shown in FIG. 7, inspection unit 50 is configured from backlash inspection section 51, feeding accuracy inspection section 54, torque inspection section 55, splicing inspection section 57, and inspection section moving mechanism 59. Backlash inspection section 51 is a unit that performs inspection and measurement of a backlash value at feeding mechanism 65. Backlash inspection section 51 inspects a degree of wear at the gear mechanism and whether teeth of the gear mechanism are engaging correctly, based on a backlash value. Backlash inspection section 51 is configured from imaging section 52, first drive motor 14 (drive pin 53), and insertion section 17. Imaging section 52 is configured as a digital camera that images sprocket section 66 from above (refer to FIG. 6). First drive motor 14 rotates feeding mechanism 65 from the outside via drive pin 53. Insertion section 17 is used for inserting reference tape 90 into sprocket section 66 from the rear of the device (the front end of feeder 60). Reference tape 90 is, for example, a member that does not deform easily, for example, a thin metal plate, and as shown in FIG. 6, feeding holes 91 and cavities 92 are formed in reference tape 90. The teeth of sprocket 67 are inserted in feeding holes 91. Cavities 92, similar to the tape used in the mounting device, are hole sections with a bottom for storing components. Feeding accuracy inspection section 54 inspects the feeding accuracy at feeding mechanism 65. Feeding accuracy inspection section 54 is a unit configured from imaging section 52 and insertion section 17. Feeding accuracy inspection section 54 captures an image when reference tape 90 is fed by a specified amount by first driving motor 69, and obtains the feeding accuracy based on the logical feeding amount and the feeding amount actually measured through imaging. Feeding accuracy inspection section 54 determines whether feeding mechanism 65 is operating correctly based on the feeding accuracy. Backlash inspection section 51 and feeding accuracy inspection section 54 are arranged on inspection section moving mechanism 59, and are moved to and from the inspection position and the retract position by inspection section moving mechanism 59. Inspection section moving mechanism 59 is configured from a guide member formed in the front-rear direction of the device, a slider on which imaging section 52 is installed and which is guided by a guide section when moving, and an actuator which moves the slider.

Torque inspection section 55 measures the driving load of feeding mechanism 65 (for example, first gear mechanism 68 or sprocket 67), and is provided with torque detection section 56. Torque detection section 55, for example, is installed on supply section moving mechanism 23 and is moved to and from the inspection position and the retract position by supply section moving mechanism 23. Torque inspection section 55 inspects the driving load of first gear mechanism 68 and the sprocket 67 based on the output value from torque detection section 56 obtained by driving first driving motor 69 after torque detection section 56 is connected to first gear mechanism 68. Splicing inspection section 57 inspects splicing sensor 75 and is provided with dummy member 58. Dummy member 58 is formed from a member (metal) used for splicing. Dummy member 58 is installed on member moving mechanism 43, and is moved to and from the inspection position and the retract position by member moving mechanism 43. Dummy member 58 has a hooked claw shape, and when the vertical surface of dummy member 58 comes into contact with a side surface of splicing sensor 75 in accordance with the movement of member moving mechanism 43, the distal end of the hooked claw comes into contact with splicing sensor 75 (refer to FIG. 4). Splicing inspection section 57 determines whether splicing sensor 75 is operating normally based on the output value of the sensor when dummy member 58 comes into contact with splicing sensor 75.

As shown in FIG. 7, control section 80 is configured as a programmable logic controller (PLC) centered on CPU 82, and performs overall control of the device. Control section 80 acquires information of feeder 60 from feeder 60 connected to feeder attachment section 13 via connector 63. Information of feeder 60 includes, for example, information of the type of the feeder 60, identification information of the feeder 60, and the like. Further, control section 80 is provided with memory section 83 such as an HDD or flash memory. History information 84 is memorized on memory section 83. History information 84 includes maintenance performance contents of feeder maintenance device 11. For example, included in history information 84 are lubricant supply counts for lubricant supply sections 20, 24, and 29, remaining amount values from remaining amount sensors 22a and 26a, cleaning counts for air cleaning sections 40 and 49, cleaning counts for liquid cleaning sections 34 and 44, remaining amount values from cleaning liquid amount sensor 35a, usage counts for air filter 18 and waste liquid filter 19, usage counts for reference tape 90 and drive pin 53, and the like.

As shown in FIG. 1, management PC 1 is provided with control section 2, memory section 3, and communication section 5. Control section 2 is configured from a microprocessor centered on a CPU, and is provided with ROM that memorizes a processing program, RAM used as a working region, and the like. Also, management PC 1 is provided with an input device such as a keyboard and a mouse for an operator to input various commands, and a display for displaying various information. Feeder information 4 and the like that is a database related to feeders used in mounting processing of the mounting device is memorized in memory section 3 of management PC 1.

Figure 8:
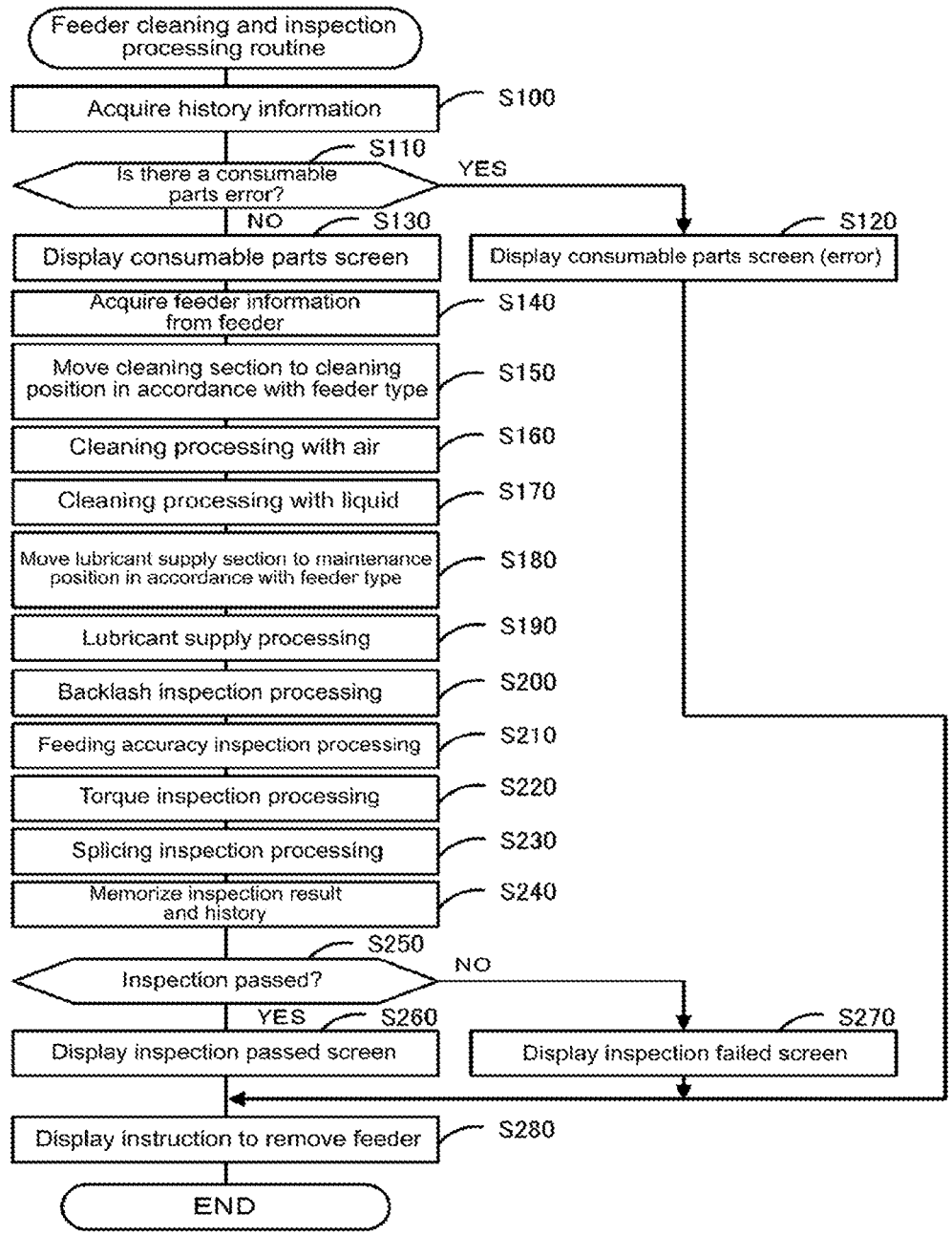
FIG. 8 is a flowchart showing an example of a feeder cleaning and inspection processing routine.

Next, descriptions are given of operation of feeder maintenance system 10 of the present embodiment configured in this manner, in particular, movements of feeder maintenance apparatus 11. FIG. 8 is a flowchart showing an example of a feeder cleaning and inspection processing routine performed by CPU 82 of control section 80. The routine is memorized in control section 80, and is performed based on a cleaning and inspection start instruction by an operator. With cleaning and inspection processing, cleaning of feeder 60, supply of lubricant, and inspection of feeder 60 are performed as a set of processing. When the routine is started, CPU 82 first acquires history information 84 (step S100), and determines whether there is an error with any consumable parts (S110). This determination is set for each consumable part, and is performed based on whether a threshold value (a permissible range) at which cleaning and inspection processing is prohibited is exceeded, or based on whether a remaining amount value of remaining amount sensor 22a or the like is below a specified value. With feeder maintenance device 11, a warning threshold value at which a warning is displayed, and a prohibition threshold at which cleaning and inspection processing is prohibited are set as usage counts (refer to FIG. 9 described later). In a case in which either of a usage count or a remaining amount value that is a measurement value of a consumable part exceeds the permissible range, CPU determines that there is an error. Also, CPU 82 determines that there is an error in a case in which there is one consumable part for which the permissible range is exceeded. As described in detail in later, CPU 82 manages remaining amount values, usage counts, and the like as history information 84.

When there is an error with a consumable part, CPU 82 displays (step S120) a consumable parts screen on a monitor, which is not shown, displays an instruction screen to remove the feeder, and ends the routine. In this manner, CPU 82 does not perform cleaning and inspection processing when replacement or replenishment of a consumable part is required. FIG. 9 shows an example of consumable parts screen 100. Consumable parts screen 100 includes, for example, state display column 101, warning value input column 102, inspection prohibited value input column 103, maintenance count display column 104, reset input column 105. In feeder maintenance device 11, as consumable parts for the cleaning sections there are cleaning liquid, air filter 18, and waste liquid filter 19, as consumable parts for the lubricant supply sections there is lubricant, and as consumable parts for the inspection section there are drive pin 53 and reference tape 90, and the like. State display column 101 displays the current state for each consumable part as "OK", "Warning", or "Error". An operator is able to enter a threshold warning value for determining a state of "Warning" for a consumable part in warning value input column 102. The warning threshold value may be set based on experience so as to issue a notice at appropriate timing regarding the need to replace or replenish the consumable part on which inspection is being performed. An operator is able to enter a threshold inspection prohibited value for determining a state of "Error" for a consumable part in inspection prohibited value input column 103. The prohibition value may be set based on experience as a value at which cleaning, supply of lubricant, or inspection cannot be performed. Maintenance count display column 104 displays a usage count for the performance of cleaning and inspection processing (maintenance) of a feeder. A reset button that is pressed to reset the maintenance count is arranged in reset input column 105. By checking consumable parts screen 100, an operator can understand the state of feeder maintenance device 11.

If there are no errors for consumable parts in step S110, that is, if the state is "OK" or "Warning" for all consumables, CPU 82 displays that fact on consumable parts screen 100 (step S130), and performs cleaning and inspection processing (step S140 to S280). In cleaning and inspection processing, CPU 82 acquires feeder information from feeder 60 attached to feeder attachment section 13 (step S140). The feeder information includes information of the type, identification information, and the like of the feeder. Next, CPU 82 moves the cleaning sections to cleaning positions corresponding to the type of the feeder (step S150). Here, CPU 82 controls position adjustment mechanism 16, cleaning section moving mechanisms 38, 39, 43, and 48, and the like, and moves air cleaning sections 30, 40, and 49, liquid cleaning sections 34, 44, and the like to the cleaning positions. Then, CPU 82 performs cleaning processing with air using air cleaning sections 30 and 40 (step S160). Here, CPU 82 supplies air to air supply sections 31, 41, and 49a, and sucks air using the suction sections 32, 42, and 49b. Thus, at feeder 60, foreign matter adhering to feeding roller 71 or sprocket section 66 to which air is blown is removed. Next, CPU 82 performs cleaning processing with cleaning liquid using liquid cleaning sections 34 and 44 (step S170). Here, CPU 82 causes liquid supply sections 35 and 45 to supply cleaning liquid, causes air supply sections 36 and 46 to supply air, and causes collection sections 37 and 47 to collect cleaning liquid. Thus, in feeder 60, lubricant that has become old is removed from first gear mechanism 68 and second gear mechanism 72 to which cleaning liquid is applied. The supply amount of air and cleaning liquid for cleaning may be appropriately set at a favorable value acquired based on experience through experiments or the like.

Next, CPU 82 moves lubricant supply sections 20 and 24 to the maintenance positions corresponding to the type of the feeder (step S180). Here, CPU 82 controls supply section moving mechanisms 23 and 27, and the like, and moves lubricant supply pipes 21 and 25, and the like to the maintenance positions. Next, CPU 82 causes the supplying process of lubricant to first gear mechanism 68 and second gear mechanism 72 to be performed using lubricant supply sections 20 and 24 (step S190). In this processing, CPU 82 causes lubricant to be intermittently discharged from lubricant supply section 20 and lubricant supply section 29 at a predetermined interval while driving first driving motor 14 and causing first gear mechanism 68 to rotate. Further, CPU 82 causes lubricant to be intermittently discharged from lubricant supply section 24 at a predetermined interval while driving second driving motor 15 and causing second gear mechanism 72 to rotate. Lubricant is spread across the entirety of first gear mechanism 68 and second gear mechanism 72 in accordance with the continued rotation. The discharge amount and the discharge interval of the lubricant may be set, as appropriate, to favorable values that are acquired empirically through testing or the like.

Figure 10:
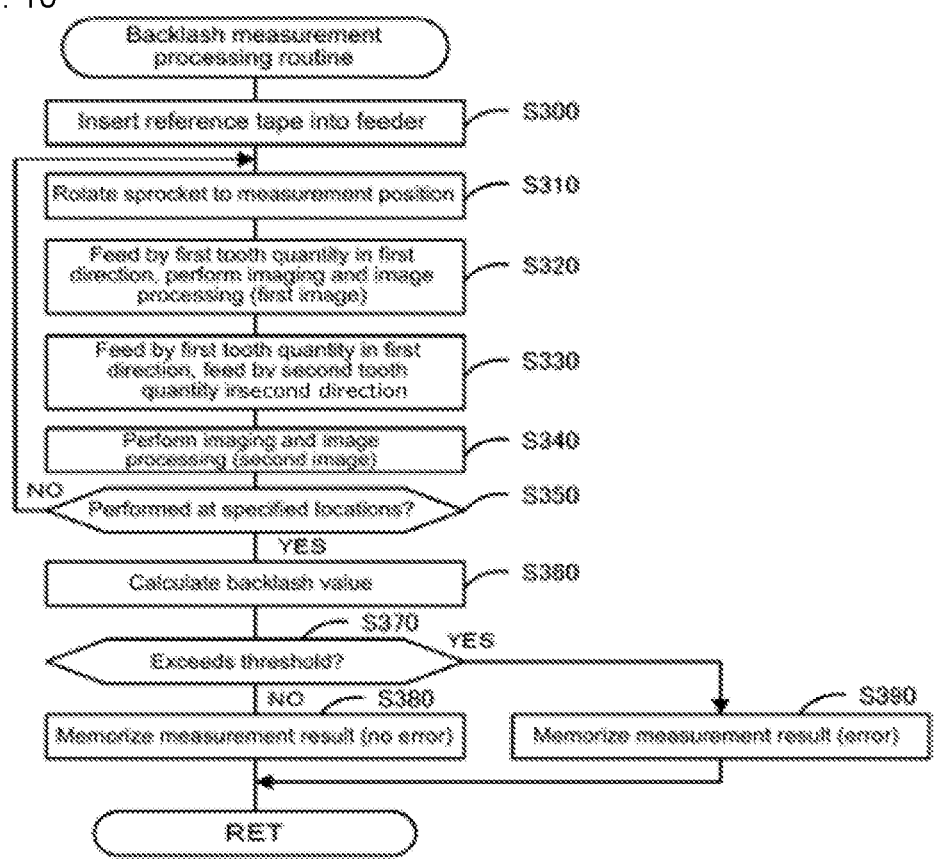
FIG. 10 is a flowchart showing an example of a backlash measurement processing routine.

When automatic cleaning and automatic supplying of lubricant are completed for feeder 60, CPU 82 causes inspection unit 50 to perform inspection of feeder 60 (steps S200 to S230). First, CPU 82 measures a backlash value of feeding mechanism 65 using backlash inspection section 51, and performs backlash inspection processing to determine whether feeding mechanism 65 is operating correctly (step S200). FIG. 10 is a flowchart showing an example of a backlash measurement processing routine. This routine is memorized in control section 80 and is performed by CPU 82. When this routine is started, CPU 82, first, controls inspection section moving mechanism 59 such that backlash inspection section 51 moves from the retract position to the inspection position, and inserts reference tape 90 through insertion section 17 to sprocket section 66 of feeder 60 (step S300). Next, CPU 82 drives first drive motor 14 so as to rotate sprocket 67 such that a tooth of sprocket 67 to be measured is positioned at the measurement position (step S310). With feeder maintenance device 11, backlash measurements are set to be performed at multiple locations of sprocket 67. Here, as shown in FIG. 6, measurements are performed at three locations, every 120 degrees, of sprocket 67.

When a tooth of sprocket 67 is positioned at the measurement position, CPU 82 feeds sprocket 67 by a first tooth quantity in a first direction, captures an image of sprocket section 66 (reference mark 77 and feeding holes 91) using imaging section 52 (first image), and performs image processing (step S320). Here, the first tooth quantity is set at one tooth, and the first direction is set as the reverse feeding direction (the front direction in FIG. 6) of sprocket 67. CPU 82 uses the position of feeding hole 91 of the first image as the deviated position at this measurement position. Next, CPU 82 drives first drive motor 14 so as to feed sprocket 67 by the first tooth quantity in the first direction, and then feeds sprocket 67 in a second direction that is different to the first direction by a second tooth quantity (step S330). Here, the second tooth quantity is set at one tooth, and the second direction is set as the normal feeding direction (the rear direction in FIG. 6) of sprocket 67. Then, CPU 82 captures an image of sprocket section 66 (reference mark 77 and feeding holes 91) using imaging section 52 (second image) and performs image processing (step S340). CPU 82 uses the position of feeding hole 91 of the second image as the reference position at this measurement position. Then, CPU 82 determines whether imaging has been performed at a specified number of locations (here, three locations) (step S350), and if imaging has not been performed at the specified number of locations, performs processing from step S310 again. That is, CPU 82 rotates sprocket 67 such that the next measurement tooth is positioned at the measurement position, retracts sprocket 67 by one tooth, captures a first image, then further retracts by one tooth and feeds forward by one tooth and captures a second image.

On the other hand, in step S350, if imaging has been performed at the specified number of locations, CPU 82 calculates a backlash value from the captured images (step S360). The backlash value is calculated as an average value of the deviation amount of the position of feeding hole 91 in the first image and the second image. For example, in the first image, the distance between reference mark 77 and feeding hole 91 is described as reference distance L (refer to FIG. 6). When feeding mechanism 65 is operating correctly, there should be virtually no position deviation of feeding hole 91 in the second image. However, deviation (L1, L2) arises with respect to reference distance L in cases in which friction or play occurs between sprocket 67 and first gear mechanism 68 of feeding mechanism 65. The backlash value is this deviation value. Continuing, CPU 82 determines whether the calculated backlash amount exceeds a threshold value (step S370). This threshold value may be set based on experience as a value of a range of a permissible deviation in operation of feeding mechanism 65. If the backlash value does not exceed the threshold value, CPU 82 memorizes information of no error as the measurement result on memory section 83 (step S380) and ends the routine. On the other hand, if the backlash value exceeds the threshold value, CPU 82 memorizes information of an error as the measurement result on memory section 83 (step S390) and ends the routine.

When the backlash measurement processing is ended, CPU 82 performs feeding accuracy inspection processing of tape of feeding mechanism 68 using feeding accuracy inspection section 54 (step S210). In this processing, CPU 82 drives first drive motor 69, and captures an image of the moving state of the reference tape using imaging section 52. Then, for example, CPU 82 performs processing of obtaining the error in the feeding amount of feeding mechanism 65 using the positional relationship between reference mark 77 and feeding hole 91 of reference tape 90. Next, CPU 82 drives first drive motor 69 and causes torque inspection processing to be performed by torque detection section 56 (step S220). In this processing, CPU 82 detects the driving load of first gear mechanism 68 and the like using torque detection section 56. Continuing, CPU 82 causes inspection processing of splicing sensor 75 to be performed using splicing inspection section 57 (step S230). In this processing, CPU 82 drives member moving mechanism 43 to position the distal end of dummy member 58 on a top section of splicing sensor 75, and acquires a detection signal from splicing sensor 75. Then, CPU 82 memorizes the inspection result linked to identification information of the feeder 60, and updates history information 84 in accordance with the performed inspection (step S240). Inspection results are stored in the database for each feeder. Also, for example, because the cleaning and lubricant supply differs in accordance with the type of feeder, such as feeder 60B for which there is no second drive motor on the member processing mechanism side, the contents of the performed cleaning and lubricant supply are recorded in history information 84.

Continuing, CPU 82 determines whether the feeder 60 passes inspection (step S250). CPU 82, for example, determines whether inspection is passed based on whether the backlash value calculated in backlash inspection is within a specified threshold. Also, CPU 82 determines whether inspection is passed based on whether the error in the feeding amount obtained in feeding accuracy inspection is within a specified permissible range. Further, CPU 82 determines whether inspection is passed based on whether the driving load obtained in torque inspection is within a specified permissible range. And, CPU 82 determines whether the inspection is passed based on whether a detection signal is received from splicing sensor 75 in the splicing inspection. In a case in which CPU 82 determines that the inspections are all passed, CPU 82 determines that the feeder 60 passes inspection, and in a case in which one or more of any of the inspections is not passed, CPU 82 determines that feeder 60 does not pass inspection. In a case in which feeder 60 passes inspection in step S250, CPU 82 displays an inspection passed screen on the display (step S260). On the other hand, if the feeder 60 does not pass inspection in step S250, CPU 82 displays a screen including inspection failed items (S270). Then, CPU 82 displays an instruction to remove the feeder 60 on the display (step S280), moves each configuration to the retract positions and ends the routine.

If a feeder 60 does not pass inspection, an operator performs maintenance work on the feeder. For example, in a case in which backlash inspection or feeding accuracy inspection is failed, an operator performs processing of disassembling and rebuilding feeding mechanism 65, or exchange of first gear mechanism 68. This work may improve the gear engagement of first gear mechanism 68 and sprocket 67. Further, in a case in which torque inspection is failed, an operator performs disassembly and cleaning of first drive motor 69, or exchange of first drive motor 69. Also, in case in which splicing sensor inspection is failed, an operator performs disassembly and cleaning of splicing sensor 75, or exchange of splicing sensor 75. By this work, feeder 60 will operate correctly.

Feeder attachment section 13 of the present embodiment corresponds to the attachment section, backlash inspection section 51 corresponds to a measurement section, control section 80 corresponds to a control section, lubricant supply sections 20, 24, and 29 correspond to lubricant supply sections, and air cleaning sections 30, 40, and 49 and liquid cleaning sections 34 and 44 correspond to cleaning sections. An example of a control method of a feeder maintenance device of the present disclosure is made clear from the descriptions of operation of feeder maintenance device 11 of the present embodiment.

With feeder maintenance device 11 of the present embodiment as described above, specified sections (such as sprocket section 66 and member processing mechanism 70) including feeding mechanism 65 of feeder 60 are cleaned using a cleaning section, and backlash of feeding mechanism 65 is measured using backlash inspection section 51 (measurement section). In this manner, because feeder maintenance device 11 performs cleaning of feeder 60, compared to an operator performing cleaning, it is possible to curtail variance in the quality of maintenance. Also, because feeder maintenance device 11 measures the backlash of feeding mechanism 65, it is possible to reliably perform maintenance related to feeding mechanism 65 of the feeder.

Also, with feeder maintenance device 11, because backlash inspection section 51 measures backlash of feeding mechanism 65 at multiple positions, compared to measuring at only one position, it is possible to perform maintenance related to feeding mechanism 65 of feeder 60 more reliably. Note that, for backlash inspection section 51, considering both simplifying processing and performing reliable measurement, it is desirable to perform measurement at three locations of the feeding mechanism. Further, with feeder maintenance device 11, backlash inspection section 51, after feeding mechanism 65 in a first direction by a first tooth quantity, feeds feeding mechanism 65 in a second direction that is an opposite direction to the first direction by a second tooth quantity that is equal to or lower than the first tooth quantity, and measures the backlash due to the movement amount of the feeding. Thus, feeder maintenance device 11 measures backlash of feeding mechanism 65 via a relatively simple method. With feeder maintenance device 11, the first tooth quantity is one, and the second tooth quantity is one, therefore, backlash can be measured with a small movement amount.

Further, feeder maintenance device 11 is provided with lubricant supply sections 20, 24, and 29 that supply lubricant to drive sections of feeder 60, and control section 80 controls lubricant supply sections 20, 24, and 29. With feeder maintenance device 11, because feeder maintenance device 11 supplies lubricant, compared to a case of supply by an operator, it is possible to curtail variance in the quality of maintenance. Also, feeder maintenance device 11 is provided with inspection unit 50 that includes feeding accuracy inspection section 54 that inspects the feeding accuracy of tape (storage member) at feeder 60, torque inspection section 55 that inspections the torque of first drive motor 69 (drive section) that feeds tape at feeder 60, and splicing inspection section 57 that inspects splicing sensor 75 that detects a splicing section of tape at feeder 60, and control section 80 also controls inspection unit 50. With feeder maintenance device 11, because various inspections of feeder 60 can be performed at inspection unit 50 in addition to backlash measurement of feeding mechanism 65, improved maintenance processing of feeders can be performed. Also, control section 80 cleans specified sections of feeder 60 using cleaning sections, supplies lubricant to drive sections using lubricant supply sections, and then uses inspection unit 50 to perform measurement of backlash, feeding accuracy inspection, torque inspection, and splicing inspection. With feeder maintenance device 11, it is possible to automatically perform various maintenance processing such as cleaning, measurement, and inspection of feeder 60.

Meanwhile, it goes without saying that the disclosure is not limited to the above-mentioned embodiment and various embodiments may be applied within the technical scope of the disclosure.

For example, in an embodiment above, inspection unit 50 is provided with feeding accuracy inspection section 54, torque inspection section 55, torque inspection section 56, and splicing inspection section 57, but the configuration is not limited to this, and one or more of these may be omitted, or another inspection section may be provided instead. With this device, because backlash inspection section 51 is provided, at least measurement of a backlash value can be performed. Also, with an embodiment above, lubricant supply sections 20, 24, and 29 are provided, but one or more of these may be omitted. With this device, because at least a cleaning section is provided, cleaning of feeder 60 can be performed.

With an embodiment above, backlash inspection section 51 performs measurement of backlash values at three locations of sprocket 67 of feeding mechanism 65, however, so long as at least two locations are measured, the configuration is not limited to three locations, and two locations, or four or more locations, may be measured.

In an embodiment above, backlash inspection section 51, during measurement, uses one as the first tooth quantity for feeding and uses one as the second tooth quantity, but so long as the backlash can be measured the configuration is not particularly limited, and the quantities may be set to any values based on experience. For example, the second tooth quantity may be a tooth quantity equal or less than the first tooth quantity. Also, backlash inspection section 51 uses the reverse feeding direction of the tape as a first direction, and a normal feeding direction of the tape as a second direction, but so long as the backlash can be measured the configuration is not particularly limited, and the normal feeding direction of the tape may be used as the first direction and the reverse feeding direction of the tape may be used as the second direction.

In an embodiment above, descriptions are given performing cleaning, supply of lubricant, and each inspection as a set of processing, but the configuration is not particularly limited to this. For example, control section 80 may perform a maintenance mode in which, after controlling the cleaning sections to clean the specified sections of feeder 60, control section 80 controls backlash inspection section 51 to measure the backlash of feeding mechanism 65, and an inspection mode in which control section 80 controls backlash inspection section 51 to measure the backlash of feeding mechanism 65 without performing cleaning. Control section 80, may be switchable to and from a maintenance mode and an inspection mode based on inputs from an operator, or may be switchable to and from a maintenance mode and an inspection mode based on an inspection count or an elapsed time. With this device, it is possible to switch between the maintenance mode and the inspection mode.

In an embodiment above, descriptions are given with feeder 60 as a maintenance target, however, the configuration is not limited to this. For example, feeder 60B may be a maintenance target. When feeder 60B is attached to feeder attachment section 13, CPU 82 acquires feeder information of feeder 60B via connector 63 and controls position adjustment mechanism 16 based on this information. Also, since feeder 60B does not have a maintenance target configuration on the left side portion of member processing mechanism 70B, CPU 82 allows second drive motor 15, lubricant supply section 24, and liquid cleaning section 44 (refer to FIG. 5) to rest based on the feeder information. Further, cleaning processing and lubricant supplying processing are performed, and inspection processing is performed in a similar manner to feeder 60 above. With this device too, it is possible to curtail variations in quality of maintenance.

With an embodiment above, feeder maintenance device 11 performs cleaning, lubricant supply, and inspection in that order, but the configuration is not limited to this. For example, feeder maintenance device 11 may perform inspection and then perform cleaning and lubricant supply. With this device, because inspection of feeder 60 is performed first, cleaning and lubricant supply are not performed unnecessarily. Also, variation in quality of maintenance can be curtailed.

In an embodiment above, feeder maintenance system 10 is provided with management PC 1 and feeder maintenance device 11, but the configuration is not limited to this, and feeder maintenance device 11 may be provided with the functions of management PC 1. Also, management PC 1 and feeder maintenance device 11 may be the feeder maintenance device.

In an embodiment above, the present disclosure is described in terms of a feeder maintenance apparatus 11; however, the present disclosure may be realized as a control method of feeder maintenance apparatus 11 or a program which realizes the control method. A control method and a program of feeder maintenance device 11 may be employed in various forms of the above feeder maintenance device 11, and steps may be added to realize various functions of the above feeder maintenance device 11.

INDUSTRIAL APPLICABILITY

The present disclosure may be applied to the industrial field of electronic component mounting.

REFERENCE SIGNS LIST

1: management PC; 2: control section; 3: HDD; 4: feeder information; 5: communication section; 10: feeder maintenance system; 11: feeder maintenance device; 12: cover; 13: feeder attachment section; 14: first drive motor; 15: second drive motor; 16: position adjustment mechanism; 17: insertion section; 18, 19: filter; 20, 24, 29: lubricant supply section; 21, 25: lubricant supply pipe; 22, 26: cylinder; 22a, 26a: remaining amount sensor; 23, 27: supply section moving mechanism; 30, 40, 49: air cleaning section; 31, 41, 49a: air supply section; 32, 42, 49b: suction section; 34, 44: liquid cleaning section; 35, 45: liquid supply section; 35a: cleaning liquid amount sensor; 36, 46: air supply section; 37, 47: collection section; 38, 39, 48: cleaning section moving mechanism; 43: member moving mechanism; 50: inspection unit; 52; imaging section; 51: backlash inspection unit; 53: drive pin; 54: feeding accuracy inspection section; 55: torque inspection section; 56: torque detection section; 57: splicing inspection section; 58: dummy member; 59: inspection section moving mechanism; 60, 60B: feeder; 61: controller; 62: memory section; 63: connector; 64: reel attachment section; 65, 65B: feeding mechanism; 66, 66B: sprocket section; 67, 67B: sprocket; 68, 68B: first gear mechanism; 69, 69B: first drive motor; 70, 70B: member processing mechanism; 71, 71B: feeding roller; 72, 72B: second gear mechanism; 73: second drive motor; 75: splicing sensor; 76: guide frame; 77: reference mark; 79: reel; 80: control section; 82: CPU; 83: memory section; 84: history information; 90: reference tape; 91: feeding hole; 92: cavity; L: reference distance; 100: consumable parts screen; 101: state display column; 102: warning value input column; 103: inspection prohibited value input column; 104: maintenance quantity display column; 105: reset input column.

The invention claimed is:

1. A feeder maintenance device comprising:
an attachment section configured to have a feeder attached, the feeder being provided with a feeding mechanism configured to feed a storage member that stores a component and be used in a mounting device which mounts the component on a board;
a cleaning section configured to clean a specified section including the feeding mechanism of the feeder;
a measurement section configured to measure backlash of the feeding mechanism; and
a control section programmed to control the cleaning section, the feeding mechanism, and the measurement section including:
after controlling the feeding mechanism to feed in a first direction by a first tooth quantity, control the feeding mechanism to feed in a second direction that is an opposite direction to the first direction by a second tooth quantity, and
control the measurement section to measure the backlash due to movement of the feed in the first direction and the second direction.

2. The feeder maintenance device according to claim 1, wherein the measurement section measures the backlash of the feeding mechanism at multiple positions.

3. The feeder maintenance device according to claim 1, wherein the second tooth quantity is equal to or lower than the first tooth quantity.

4. The feeder maintenance device according to claim 1, wherein the control section is programmed to perform:
a maintenance mode of controlling the measurement section so as to measure backlash of the feeding mechanism after controlling the cleaning section so as to clean the specified position using the cleaning section, and an inspection mode of controlling the measurement section so as to measure backlash of the feeding mechanism without performing cleaning.

5. The feeder maintenance device according to claim 1, further comprising:
   a lubricant supply section configured to supply lubricant to a drive section of the feeder,
   wherein the control section is programmed to control the lubricant supply section.

6. The feeder maintenance device according to claim 1, further comprising:
   an inspection unit including at least one among
      a feeding accuracy inspection section configured to detect feeding accuracy of the storage member at the feeder,
      a torque inspection section configured to detect a torque of a drive section that feeds the storage member at the feeder, and
      a splicing inspection section configured to inspect a detecting sensor that detects a splicing section that performs splicing of the storage member at the feeder,
   wherein the control section is programmed to control the inspection unit.

7. The feeder maintenance device according to claim 1, further comprising:
   a lubricant supply section configured to supply lubricant to a drive section of the feeder, and
   an inspection unit including
      a feeding accuracy inspection section configured to detect feeding accuracy of the storage member at the feeder,
      a torque inspection section configured to detect a torque of the drive section that feeds the storage member at the feeder, and
      a splicing inspection section configured to inspect a detecting sensor that detects a splicing section that performs splicing of the storage member at the feeder,
   wherein the control section is programmed to
      cause the cleaning section to clean the specified section, cause the lubricant supply section to supply lubricant to the drive section, and then cause the measurement section to measure the backlash, and
      cause the inspection unit to perform the feeding accuracy detection, the torque inspection, and the splicing inspection.

8. A control method for a feeder maintenance device provided with an attachment section configured to have a feeder attached, the feeder being provided with a feeding mechanism configured to feed a storage member that stores a component and be used in a mounting device which mounts the component on a board, a cleaning section configured to clean a specified section including the feeding mechanism of the feeder, a measurement section configured to measure backlash of the feeding mechanism, and, a control section programmed to control the cleaning section, the feeding mechanism, and the measurement section, the control method comprising:
   after controlling the feeding mechanism to feed in a first direction by a first tooth quantity, controlling the feeding mechanism to feed in a second direction that is an opposite direction to the first direction by a second tooth quantity; and
   controlling the measurement section to measure the backlash due to movement of the feed in the first direction and the second direction.

9. The control method according to claim 8, further comprising controlling the measurement section to measure the backlash of the feeding mechanism at multiple positions.

10. The control method according to claim 8, wherein the second tooth quantity is equal to or lower than the first tooth quantity.

11. The control method according to claim 8, further comprising:
   performing a maintenance mode of controlling the measurement section so as to measure backlash of the feeding mechanism after controlling the cleaning section so as to clean the specified position using the cleaning section; and
   performing an inspection mode of controlling the measurement section so as to measure backlash of the feeding mechanism without performing cleaning.

12. An apparatus comprising:
   at least one processor programmed to:
   control a feeding mechanism to feed in a first direction by a first tooth quantity;
   after controlling the feeding mechanism to feed in the first direction by the first tooth quantity, control the feeding mechanism to feed in a second direction that is an opposite direction to the first direction by a second tooth quantity, and
   measure backlash of the feeding mechanism due to movement of the feed in the first direction and the second direction.

13. The apparatus according to claim 12, wherein the at least one processor is programmed to measure the backlash of the feeding mechanism at multiple positions.

14. The apparatus according to claim 12, wherein the second tooth quantity is equal to or lower than the first tooth quantity.

15. The apparatus according to claim 12, wherein the at least one processor is configured to:
   measure the backlash of the feeding mechanism after the feeding mechanism has been cleaned, and
   measure the backlash of the feeding mechanism without the feeding mechanism having been cleaned.

16. The feeder maintenance device according to claim 2, wherein the control section is programmed to calculate a backlash value based upon the measured backlash of the feeding mechanism at the multiple positions.

17. The feeder maintenance device according to claim 1, wherein the control section is programmed to:
   before controlling the feeding mechanism to feed in the first direction by the first quantity, control the feeding mechanism to feed in the first direction by the first quantity; and
   control the measurement section to measure the backlash due to movement of the feed in the first direction and due to the movement of the feed in the first direction and the second direction.

18. The feeder maintenance device according to claim 17, wherein the control section is programmed to:
   control the measurement section to measure the backlash due to the movement of the feed in the first direction by controlling the measurement section to take a first image of the feeder mechanism after the feed in the first direction;
   control the measurement section to measure the backlash due to the movement of the feed in the first direction and the second direction by controlling the measurement section to take a second image of the feeder mechanism after the feed in the first direction and the second direction; and calculate a backlash value based upon deviation amounts in the first image and the second image.

19. The control method according to claim 9, further comprising calculating a backlash value based upon the measured backlash of the feeding mechanism at the multiple positions.

20. The apparatus according to claim 13, wherein the at least one processor is configured to calculate a backlash value based upon the measured backlash of the feeding mechanism at the multiple positions.

* * * * *